(12) United States Patent
Shmagin et al.

(10) Patent No.: US 6,560,125 B1
(45) Date of Patent: May 6, 2003

(54) SHIELD FOR SHIELDING RADIO COMPONENTS

(75) Inventors: Irina Konstantinonva Shmagin, Itasca, IL (US); Nicholas Evangelos Buris, Deer Park, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/034,887

(22) Filed: Dec. 28, 2001

(51) Int. Cl.[7] .................................................. H05K 9/00
(52) U.S. Cl. ...................... 361/818; 174/35 R; 257/659; 455/300
(58) Field of Search .................................. 361/760, 778, 361/792, 799, 800, 816, 818; 257/659; 455/300, 301; 174/51, 35 R, 35 GC, 35 CE, 35 MS; 439/607–610

(56) References Cited

U.S. PATENT DOCUMENTS

| | | | | |
|---|---|---|---|---|
| 3,816,911 A | * | 6/1974 | Knappenberger | 29/841 |
| 4,404,617 A | * | 9/1983 | Ohyama et al. | 361/818 |
| 5,099,396 A | * | 3/1992 | Barz et al. | 361/818 |
| 5,491,301 A | * | 2/1996 | Akiba et al. | 174/250 |
| 5,668,406 A | * | 9/1997 | Egawa | 257/690 |
| 6,011,700 A | * | 1/2000 | Matsuzaki | 361/816 |
| 6,181,573 B1 | * | 1/2001 | Riet | 361/816 |
| 6,350,951 B1 | * | 2/2002 | Askew | 174/52.2 |
| 6,472,724 B1 | * | 10/2002 | Matsuzawa et al. | 257/659 |
| 6,478,622 B1 | * | 11/2002 | Hwang | 439/607 |

* cited by examiner

*Primary Examiner*—Gerald Tolin
(74) *Attorney, Agent, or Firm*—Kenneth A. Haas

(57) ABSTRACT

Edges of the surface metal of a cage shield are bent inwardly towards an interior of a cavity formed by the cage shield to eliminate leakage at apertures in the shield. In a further embodiment, bends can also be formed by the metal layers and through holes within a printed circuit board.

11 Claims, 2 Drawing Sheets

SHIELD FOR SHIELDING RADIO COMPONENTS

BACKGROUND OF THE INVENTION

1. Technical Field

The present invention relates to electromagnetic shields and, more particularly, relates to edge treatments for high efficiency electromagnetic shields.

2. Description of the Related Art

Metal cage shields on radio circuit boards are used to shield components from one another and also reduce electromagnetic emissions. Metal cage shields typically use straight edges at the point of contact with a printed circuit board. Sometimes, for solder reliability reasons, these shields have their edges bent outward.

Shields on radio circuit boards usually require apertures or openings in the shield because the signal must get out. These apertures in shields noticeably reduce the effectiveness of the shielding.

The inventors of the present invention have discovered that these practices compromise shielding effectiveness. A more effective shield having an improved edge treatment is provided by the invention as will be described below.

SUMMARY OF THE INVENTION

A conductive shield surrounds one or more radio components to shield them but some leakage of electromagnetic fields occurs. It has been discovered that these fields are formed primarily by eddy currents induced in the metal of the shield and that the emission through the air is strongest at the edges of the shield. It is a feature of the present invention that the edges of the surface metal of the cage shield are bent inwardly towards an interior of a cavity formed by the cage shield to eliminate this leakage.

Apertures or openings in the shield are required in the shield to allow signals to get in and out to and from the radio components. Most of the leakage of the electromagnetic fields can occur at these apertures. According to a further feature of the present invention, the edges of the shield at the apertures are bent inwardly towards a cavity formed by the shield for improved shielding and to eliminate more leakage of the electromagnetic fields. The proposed shield has inwardly folded edges to reposition the strong edge currents and confine their radiation within the shielded volume. Typically, this confined radiation is subsequently attenuated by losses in the interior of the shield, the packaging material of the radio components and by losses in the printed circuit board.

Metalization patterns on a printed circuit board provide a ground plane for shielding the portion below the conductive cage. Metalized through holes or vias connect the conductive cage to the ground place. When an aperture is created along an edge formed of the printed circuit board, the metalized through holes can be pointed inwardly to confine the radiation from the edges to within the shielded volume.

The details of the preferred embodiments of the invention may be readily understood from the following detailed description when read in conjunction with the accompanying drawings wherein:

DETAILED DESCRIPTION OF THE PREFERRED EMBODIMENTS

The present invention treats the metal edges, particularly at apertures in the shield, in a way that reduces emissions.

At high frequencies undesired electromagnetic fields radiate from radio components, particularly unbalanced components of a circuit, and induce eddy currents on a cage shield. The eddy currents cause electromagnetic emissions to occur from the surfaces of the metal cage shield itself. This strong electromagnetic emission from the surface of the cage shield reduces the effectiveness of the shielding.

Figure 1:
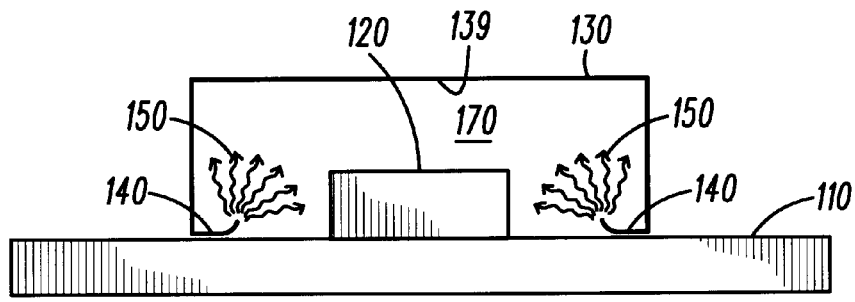
FIG. 1 illustrates a general side view of a one layer printed circuit board according to a first embodiment of the invention for holding a radio component covered by a conductive cage having inwardly bent edges that inwardly emit electromagnetic energy as illustrated.

FIG. 1 illustrates a general side view of a one layer printed circuit board 110 according to an embodiment of the invention for holding a radio component 120 covered by a conductive cage 130 and forming a cavity 170. The conductive cage 130 has inwardly bent edges 140 that inwardly emit electromagnetic energy 150, as illustrated.

As shown in FIG. 1, the present invention positions the strongly radiating edges of the conductive cage 130 inside the cavity 170. This reduces significantly the amount of radiation outside of the cavity 170. Without the inwardly bent edges 140, electromagnetic energy is emitted from the edges of the cage 130 towards an outside of the cavity 170. The energy radiated inside the cavity 170 tends to dissipate through the losses in the interior of the shield, the packaging material of the radio components and by losses in the printed circuit board 110. The inside surface of the conductive cage 130 can be coated with an absorptive material such as ferrite paint 139 to enhance the loss mechanism within the cavity 170.

As defined herein, a printed circuit board is not printed per se. The printed circuit board preferably has copper lines formed by printing or otherwise etched or deposited on a FR-4 or other substrate. Different types of materials can be used as the printed circuit board substrate.

Figure 2:
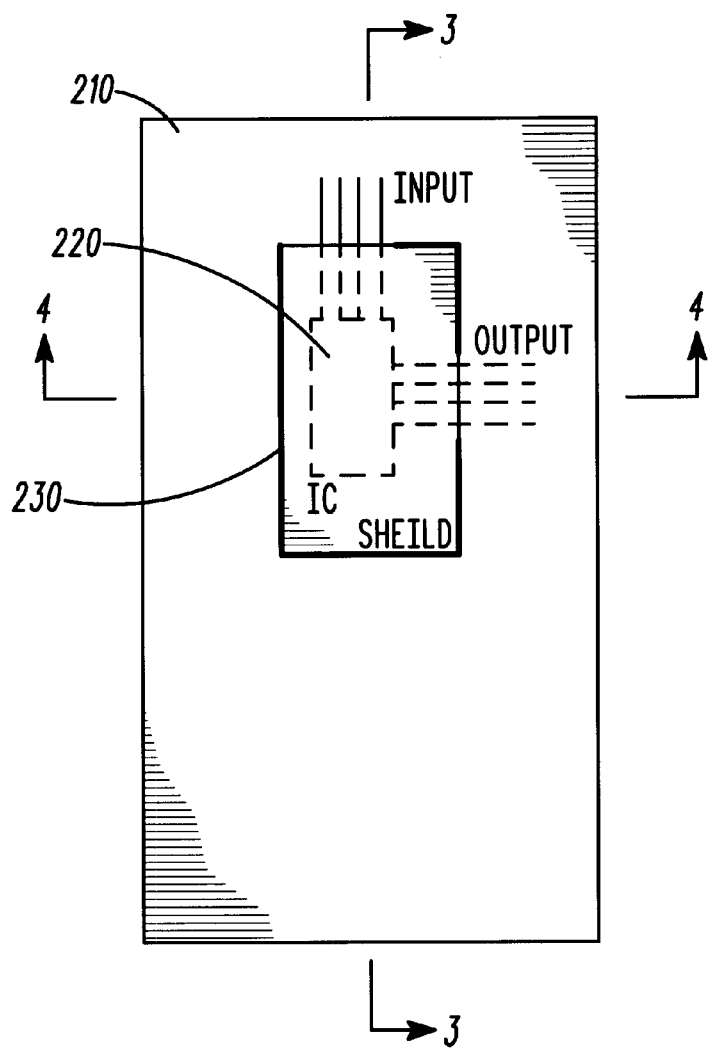
FIG. 2 illustrates a plan view of a two layer printed circuit board according to a second embodiment of the invention for holding a radio component covered by a conductive cage having inwardly bent edges.

FIG. 2 illustrates a plan view of a two layer printed circuit board 210 according to a second embodiment of the invention for holding a radio component 220 covered by a conductive cage 230 having inwardly bent edges. Further detail of the constriction of the second embodiment will be apparent from the side views of the following FIGS. 3 and 4.

Figure 3:
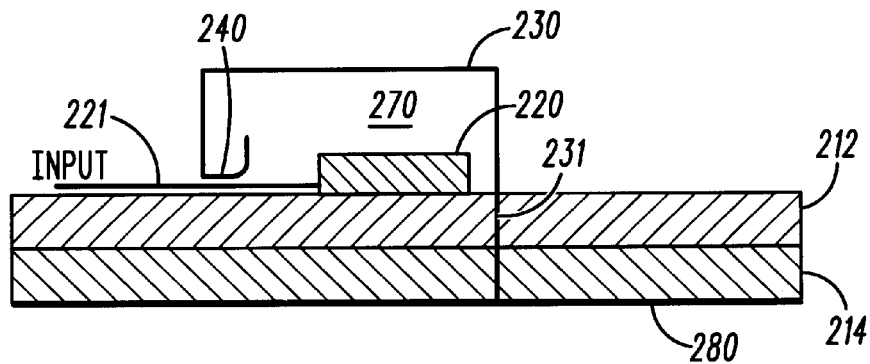
FIG. 3 illustrates a top side view of a two layer printed circuit board along the 3—3 section line in FIG. 2 according to the second embodiment of the invention for holding a radio component covered by a conductive cage having inwardly bent edges.

FIG. 3 illustrates a top side view of the two layer printed circuit board along the 3—3 section line in FIG. 2 according to the second embodiment of the invention for holding the radio component 220 covered by the conductive cage 230 having inwardly bent edges 240. The printed circuit board has first and second layers 212 and 214.

Figure 4:
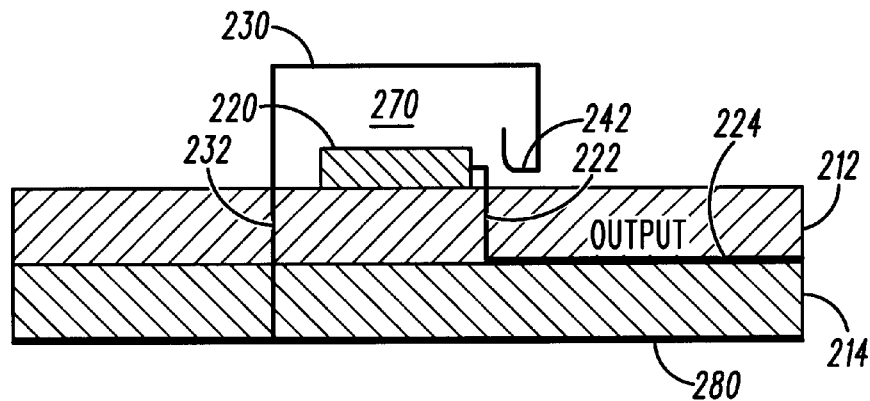
FIG. 4 illustrates a right side view of a two layer printed circuit board along the 4—4 section line in FIG. 2 according to the second of the invention for holding a radio component covered by a conductive cage having inwardly bent edges.

FIG. 4 illustrates a right side view of the two layer printed circuit board along the 4—4 section line in FIG. 2 according to the second embodiment of the invention. The printed circuit board has first and second layers 212 and 214 and holds the radio component 220 covered by the conductive cage 230 having inwardly bent edges 242.

As illustrated in FIGS. 2 and 3, input line 221 to the radio component 220 is formed by a metalization layer on the top of the first layer 212. The input line 221 passes though an aperture in the conductive cage 230. The edge 240 is inwardly bent at the aperture towards an interior cavity 270. A metalized through hole 231 connects to the conductive cage 230 through the first and second layers 212 and 214. The metalized through hole 231 electrically connects the conductive cage 230 to a ground plane metalization 280 on a bottom of the second layer 214.

Also, as illustrated in FIGS. 2 and 4, an output line 224 to the radio component 220 is formed by a metalization layer on the middle between the first and second layers 212 and 214 and a metalized through hole 222 which connects to leads of the radio component 220. The output line 224 passes though an aperture in the conductive cage 230. The edge 242 is inwardly bent at the aperture towards the interior cavity 270. A metalized through hole 232 connects to the conductive cage 230 through the first and second layers 212 and 214. The metalized through hole 232 electrically connects the conductive cage 230 to a ground plane metalization 280 on a bottom of the second layer 214, The second embodiment of FIGS. 2–4 demonstrates that connections to the radio component 220 such as the input and output lines 221 and 224 can be provided on either a top or a middle layer of a multilayer printed circuit board. As will be seen from the third embodiment illustrated below with respect to FIG. 5, the bent shield can be constructed within the multilayer circuit board using lines on the surface of the printed circuit board and lines within metalized through holes of the printed circuit board.

Figure 5:
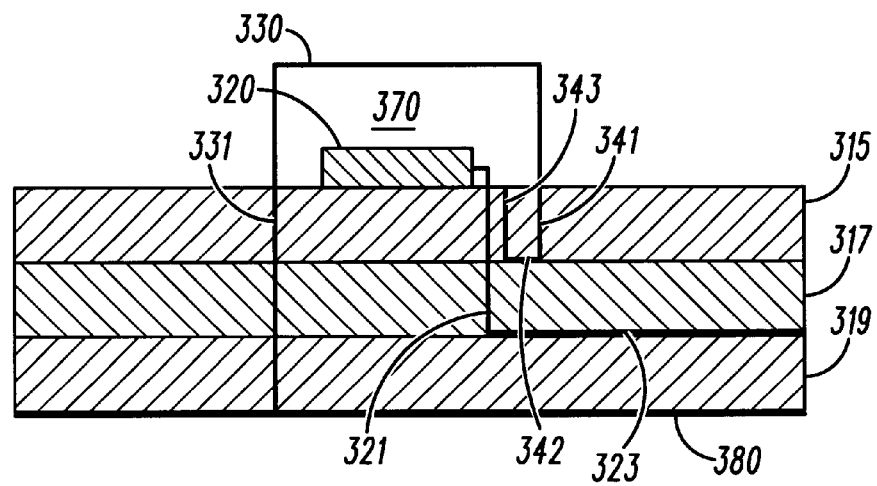
FIG. 5 illustrates a side view of a three layer printed circuit board according to a third embodiment of the invention for holding a radio component covered by a conductive cage having inwardly bent edges.

FIG. 5 illustrates a side view of a three layer printed circuit board according to a third embodiment of the invention for holding a radio component 320 covered by a conductive cage 330 having inwardly bent edges. The inwardly bent edges are constructed using metalization of inner layers 342 of the printed circuit board and metalized through holes 341 and 343 in the printed circuit board.

Input and output lines from leads on the radio component 320 connect through a metalized through hole 321 to a metalization 323 between the second and third layers 317. The line 321 of the metalized through hole passes through an aperture in the shield formed by the above metalization 341, 342 and 343. Thus the bent edge at the aperture is formed on the shield within layers of the printed circuit board and an inner lead passing within the printed circuit board is shielded. The above principles are not limited to three layer circuit boards; the above example applies to two layer circuit boards and four or more layer circuit boards.

A metalized through hole 331 connects to the conductive cage 330 through the first, second and third layers 315, 316 and 317. The metalized through hole 331 electrically connects the conductive cage 330 to a ground plane metalization 380 on a bottom of the third layer 319.

And output line 323 from the radio component 320 extends through a metalized through hole 321 and a metalization between the second layer 317 and the third layer 319 of the three layer printed circuit board.

Simulations have been performed using three dimensional finite element based software to test the idea of the present invention. For certain cases, simulation has indicated up to a 20 dB efficiency improvement when the edges of a shield were folded.

The straight-edge shields of the prior art re-radiate at the edges in several directions, inside and outside the shield. The folded edges, facing inside the shield, re-radiate within the shield itself.

Although the invention has been described and illustrated in the above description and drawings, it is understood that this description is by example only, and that numerous changes and modifications can be made by those skilled in the art without departing from the true spirit and scope of the invention. Although the examples in the drawings depict only example constructions and embodiments, alternate embodiments are available given the teachings of the present patent disclosure. For example the conductive shield can be formed by plating or painting a surface rather than forming a shield made of metal provided it is insulated from the radio components. The drawings are for illustrative purposes and, although relative sizes can be seen, they are not drawn to scale.

What is claimed is:

1. An apparatus comprising:
   at least one radio component on a printed circuit board;
   a shield including a conductive cage covering the radio component and metalization patterns on the printed circuit board, the shield surrounding the at least one radio component to form an electromagnetic cavity; and
   wherein the shield has at least one aperture and wherein an edge of the aperture points inwardly towards an inside of the electromagnetic cavity and upwardly away from the printed circuit board and leads to the at least one radio component pass through the aperture.

2. The apparatus according to claim 1,
   wherein metalized through holes in the printed circuit board are connected to the metalized patterns on the printed circuit board; and
   wherein at the aperture metalized through holes point inwardly towards an inside of the electromagnetic cavity.

3. The apparatus according to claim 1, wherein, at the at least one aperture, the shield is bent inwardly at an angle sufficient to avert electromagnetic energy from escape through the aperture.

4. The apparatus according to claim 3, wherein, at the at least one aperture, the shield is bent inwardly 90 degrees or greater.

5. The apparatus according to claim 3, wherein, at the at least one aperture, the shield is bent inwardly at approximately 180 degrees.

6. The apparatus according to claim 1, wherein the conductive cage is connected to a ground of the printed circuit board.

7. The apparatus according to claim 1, wherein the metalization patterns on the printed circuit board that make up the shield comprise metalized through holes in the printed circuit board.

8. The apparatus according to claim 1,
   wherein the metalization patterns on the printed circuit board which make up the shield comprise a ground plane of the printed circuit board; and wherein the metalized through holes connect the conductive cage covering the radio component and the ground plane of the printed circuit board.

9. The apparatus according to claim 1, wherein at least one of the leads pass through the aperture on a top surface of the printed circuit board; and wherein an edge of the shield is inwardly bent at the aperture towards the interior of the cavity.

10. The apparatus according to claim 1, wherein the printed circuit board comprises a multiple layer printed circuit board;

wherein at least one of the leads pass through the aperture on a middle surface of the multiple layer printed circuit board; and wherein an edge of the conductive material of the conductive cage is inwardly bent at the aperture towards the interior of the cavity.

11. The apparatus according to claim 1, wherein the printed circuit board comprises a multiple layer printed circuit board;

wherein at least one of the leads pass through the aperture on a middle surface of the multiple layer printed circuit board; and wherein metalized through holes and metalization patterns form an inwardly bent shield at the aperture towards the interior of the cavity.

* * * * *